(12) United States Patent
Cern

(10) Patent No.: US 7,005,943 B2
(45) Date of Patent: Feb. 28, 2006

(54) FILTER FOR SEGMENTING POWER LINES FOR COMMUNICATIONS

(75) Inventor: Yehuda Cern, Brookline, MA (US)

(73) Assignee: Ambient Corporation, Newton, MA (US)

( * ) Notice: Subject to any disclaimer, the term of this patent is extended or adjusted under 35 U.S.C. 154(b) by 101 days.

(21) Appl. No.: 10/688,264

(22) Filed: Oct. 17, 2003

(65) Prior Publication Data

US 2004/0085172 A1    May 6, 2004

Related U.S. Application Data

(60) Provisional application No. 60/419,174, filed on Oct. 17, 2002.

(51) Int. Cl.
*H01F 17/04* (2006.01)
(52) U.S. Cl. ............... 333/175; 336/175; 340/310.17; 307/147
(58) Field of Classification Search ........... 340/310.01, 340/310.02, 310.03, 310.04, 310.06, 310.07, 340/310.17; 333/12, 175, 177, 181, 185; 307/147; 336/175
See application file for complete search history.

(56) References Cited

U.S. PATENT DOCUMENTS

| | | | |
|---|---|---|---|
| 3,924,223 A | 12/1975 | Whyte et al. | 307/1 |
| 4,369,416 A | 1/1983 | Zapp et al. | 333/175 |
| 4,434,396 A * | 2/1984 | Montague | 323/230 |
| 4,675,579 A * | 6/1987 | Hardy et al. | 315/318 |
| 4,760,484 A | 7/1988 | Walker | 361/18 |
| 6,191,589 B1 | 2/2001 | Clunn | 324/424 |

OTHER PUBLICATIONS

Written Opinion dated Jan. 6, 2005 from PCT/US03/33081.

* cited by examiner

*Primary Examiner*—Dean Takaoka
(74) *Attorney, Agent, or Firm*—Ohlandt, Greeley, Ruggiero & Perle, LLP

(57) ABSTRACT

There is provided a method for blocking a portion of energy of a signal in a power line. The method includes equipping a high frequency magnetic core with a coil, connecting a capacitor across terminals of the coil to create a resonant circuit that resonates at a frequency of the signal, and placing the magnetic core around the power line, at a location where the blocking is desired.

4 Claims, 3 Drawing Sheets

FILTER FOR SEGMENTING POWER LINES FOR COMMUNICATIONS

CROSS-REFERENCE TO RELATED APPLICATIONS

The present application is claiming priority of U.S. Provisional Patent Application Ser. No. 60/419,174, filed on Oct. 17, 2002, the content of which is herein incorporated by reference.

BACKGROUND OF THE INVENTION

1. Field of the Invention

The present invention relates to power line communications, and more particularly, to a technique for blocking a portion of energy of a signal, e.g., a spurious signal in a power line.

2. Description of the Related Art

Power line communications systems may send data signals over multiple sets of proximate lines, such as medium voltage and low voltage lines strung on the same utility poles or multiple sets of lines of the same voltage class on the same poles. Over distances of hundreds of meters, there can be significant induction of signal from one set of lines to another, and these induced signals can appear to modem receivers as background noise.

To some extent, the induced signal strength is a function of the cumulative distance that the lines run together. This induced signal, which is a spurious signal, can be attenuated by interrupting the continuity of the line for the relevant frequencies. This interruption can be achieved by attaching filters in series with the lines, the filters having a high impedance at the frequencies of interest. Usually, interrupting a power line circuit and service to customers is unacceptable.

SUMMARY OF THE INVENTION

There is provided a method for blocking a portion of energy of a signal in a power line. The method includes equipping a high frequency magnetic core with a coil, connecting a capacitor across terminals of the coil to create a resonant circuit that resonates at a frequency of the signal, and placing the magnetic core around the power line, at a location where the blocking is desired.

DESCRIPTION OF THE INVENTION

A signal filter in accordance with the present invention achieves segmentation of lines over specific frequency bands, without interrupting service. A series-connected filter, in the form of a filter, i.e. a clamp-on filter, is clamped onto an energized power line. The clamp-on filter includes a split magnetic core and a secondary coil, across which a capacitor is connected so as to create a parallel resonant circuit. The impedance of the parallel resonant circuit is coupled into the power line circuit, thus introducing a series impedance having a magnitude that is substantial over a particular frequency band. When the particular frequency band includes the spurious signal frequency, the filter reduces the magnitude of spurious current flowing in the power line.

For spread spectrum communications, the width of a communications frequency band is typically wider than a resonance band achieved by a single LC circuit. A wider band-blocking filter can be achieved by using two or more such clamp-on transformer-filters, each tuned to a slightly different frequency. Typically, greater than 10 dB attenuation can be obtained from one set of two or more such filters.

A transformer is formed by the core, power line, and secondary winding. Conditions for effective coupling of the filtering impedance into the power line include a high transformer coupling coefficient, exceeding approximately 0.7. The core material for the transformer, and an optional air gap between the core halves, are chosen so that the filter does not saturate, for power currents up to the maximum flowing through the line.

Figure 1:
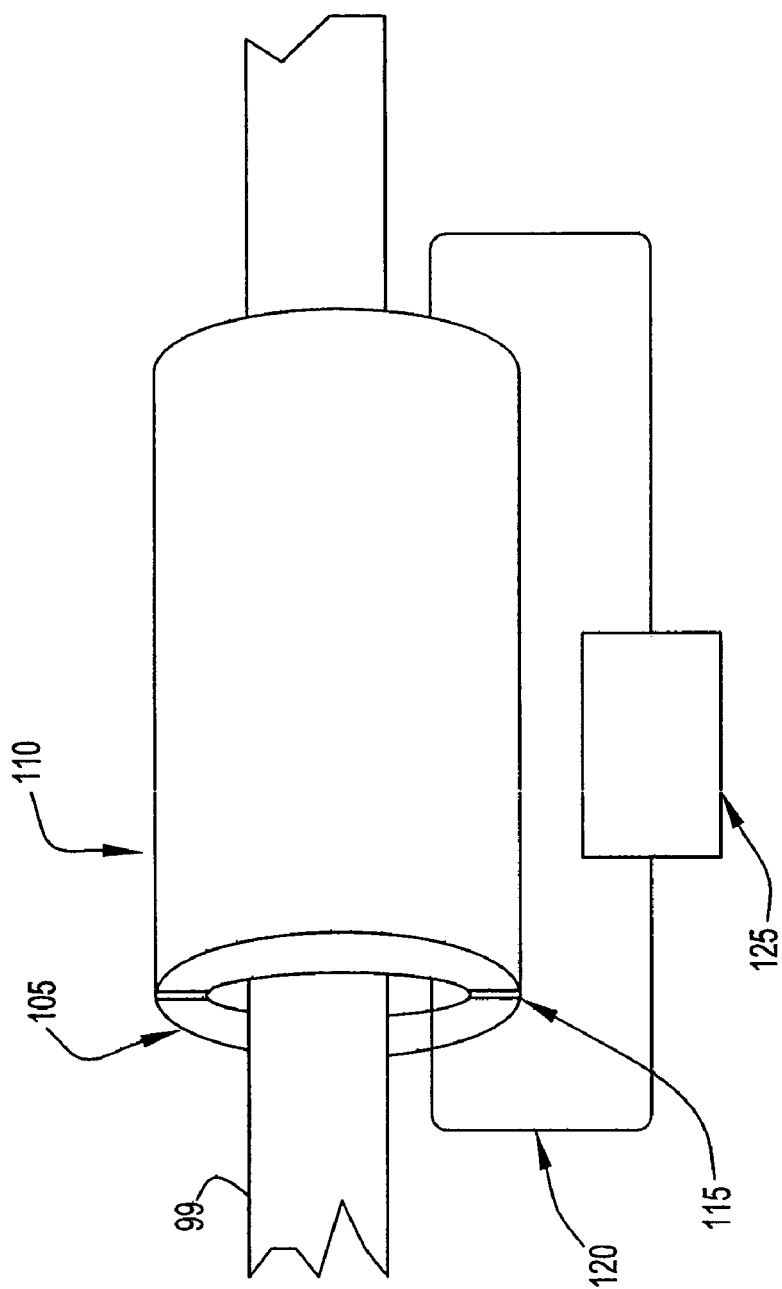
FIG. 1 is an illustration of a physical attachment of a filter to a power line.

FIG. 1 is an illustration of a filter clamped around a power line 99. A core is configured of core halves 105 and 110, which are clamped around power line 99. Optionally, core halves 105 and 110 are separated by a gap 115. Power line 99 serves as a primary winding, and a secondary winding 120 of one or more turns passes through the core, and is connected to a capacitor 125. The value of capacitor 125 is selected to resonate with the inductance of secondary winding 120 in the frequency band intended to be blocked by the filter.

Figure 2:
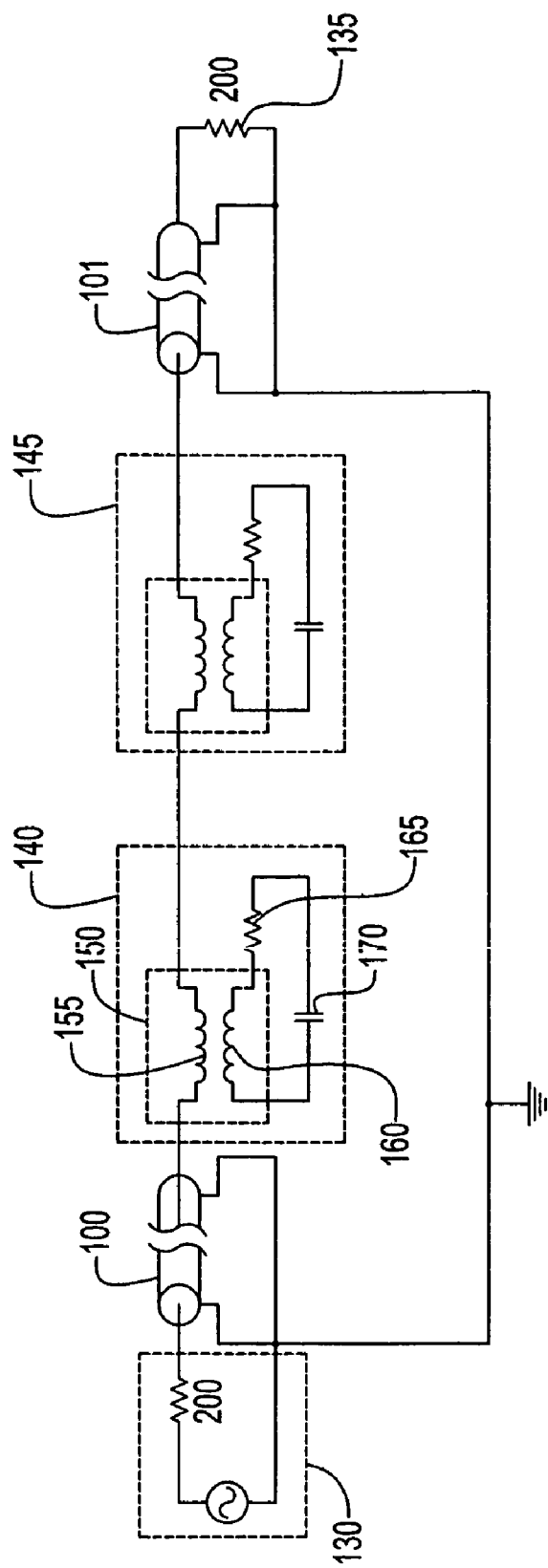
FIG. 2 is a schematic diagram of two filters attached to a power line.

FIG. 2 is a schematic of a power line with two filters attached, in accordance with the present invention. The power line is represented by segments 100 and 101 of transmission lines. A signal source 130 with its internal impedance represent a spurious signal coupled to segment 100 from a power line network to the left of segment 100. A signal emerging from segment 101 is measured across a termination resistance 135, representing power lines continuing to the right.

Clamp-on filters 140 and 145 are tuned to slightly different frequencies within the frequency band of the spurious signal, providing a broadened frequency blocking capability, preventing a significant proportion of the spurious signal energy from reaching power line segment 101 and further points downstream represented by termination resistance 135. Filter 140 includes a transformer 150 with segment 100 serving as a primary winding 155, and a wire serving as a secondary winding 160 (see FIG. 1, reference 120). A resistor 165 represents the copper and core losses. A capacitor 170 resonates with secondary winding 160 at a frequency in a desired stop band.

Filters 140 and 145 act together as a composite filter. They differ only in their slightly different resonant frequencies, to widen the frequency band over which the composite filter operates. While two filters are shown in FIG. 1, a single filter may suffice for a relatively narrowband signal, or may be extended to more than two filters for a wider signal.

Figure 3:
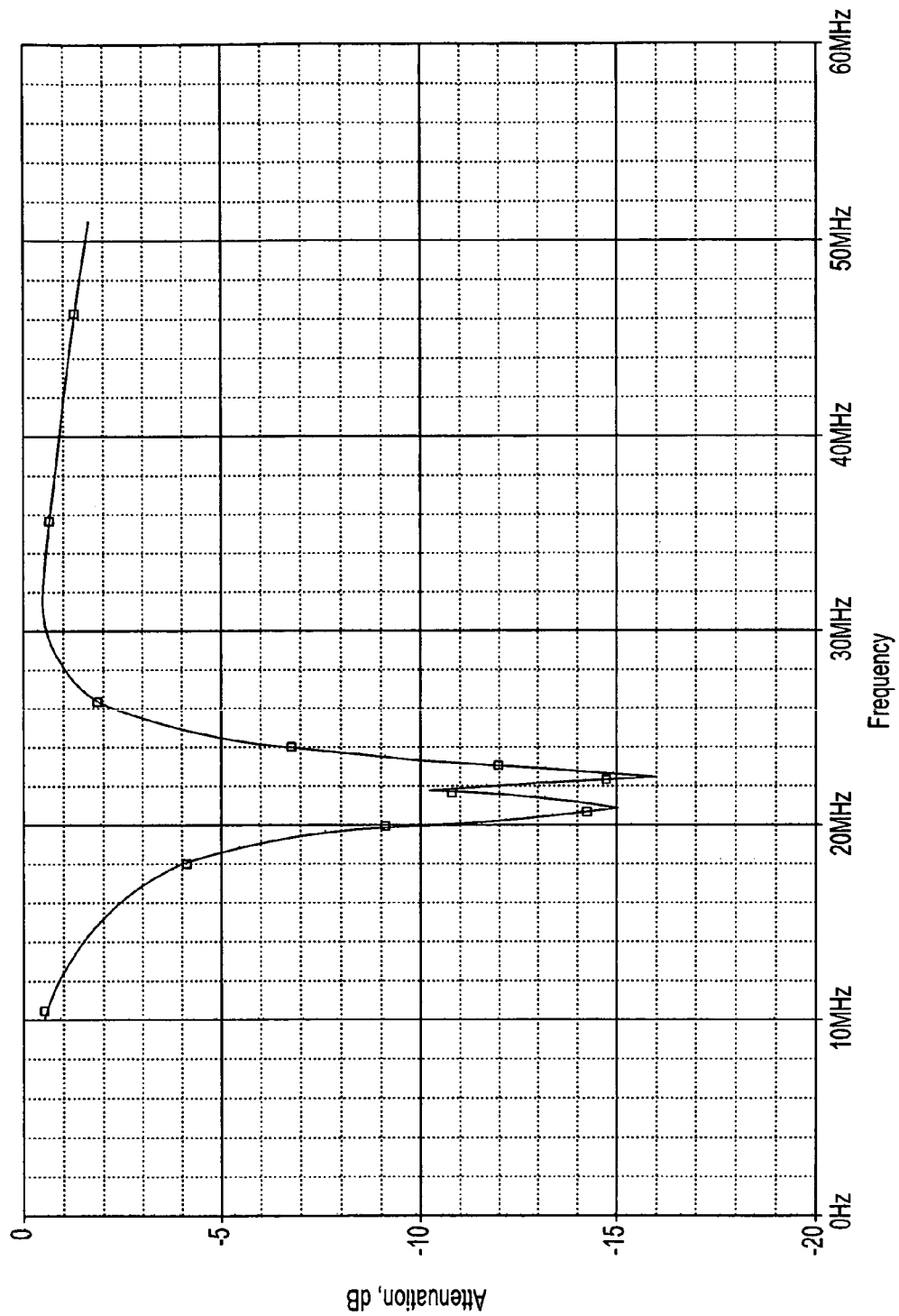
FIG. 3 is a plot of attenuation of signals by the filters of FIG. 2.

FIG. 3 is a graph showing a simulation of a filter response for the circuit in FIG. 2. The values used for the simulation are: source, load and power line impedances are each 200 ohms, the filter primary and secondary inductances are each 1 microhenry, the coupling coefficient is 0.7, capacitor 160 is 50 pF, capacitor is 57 pF, and the loss resistance is 5 ohms. The simulation shows that the composite filter attenuates signals in the 21.1 to 23.4 MHz band by more than 10 dB, and allows signals outside the attenuation band to pass through relatively unimpeded.

There is thus provided a method for blocking a portion of energy of a signal in a power line. The method includes (a) equipping a high frequency magnetic core with a coil, (b) connecting a capacitor across terminals of the coil to create a resonant circuit that resonates at a frequency of the signal, and (c) placing the magnetic core around the power line, at a location where the blocking is desired. The core may have an air gap. Also, if the resonant circuit is regarded as a first resonant circuit having a first frequency band blocking characteristic, the method can also include performing the equipping, the connecting and the placing to provide a second resonant circuit tuned to a different frequency than the first resonant circuit to create a second frequency band blocking characteristic that is wider than the first frequency band blocking characteristic.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A method for blocking a portion of energy of a signal in a power line, comprising:

equipping a high frequency magnetic core with a coil;

connecting a capacitor across terminals of said coil to create a resonant circuit that resonates at a frequency of said signal, wherein said resonant circuit is a first resonant circuit having a first frequency band blocking characteristic;

placing said magnetic core around said power line at a location where said blocking is desired; and performing said equipping, said connecting and said placing to provide a second resonant circuit tuned to a different frequency than said first resonant circuit to create a second frequency band blocking characteristic that is wider than said first frequency band blocking characteristic.

2. The method of claim 1, wherein said core includes an air gap.

3. An apparatus for blocking a portion of energy of a signal in a power line, comprising:

a first high frequency magnetic core with a first coil;

a first capacitor connected across terminals of said first coil to create a first resonant circuit that resonates at a frequency of said signal, and has a first frequency band blocking characteristic, wherein said first high frequency magnetic core is placed around said power line at a location where said blocking is desired;

a second high frequency magnetic core with a second coil; and a second capacitor connected across terminals of said second coil to provide a second resonant circuit tuned to a different frequency than said first resonant circuit to create a second frequency band blocking characteristic that is wider than said first frequency band blocking characteristic.

4. The apparatus of claim 3, wherein said core includes an air gap.

* * * * *